United States Patent
Li et al.

(10) Patent No.: US 9,252,166 B2
(45) Date of Patent: Feb. 2, 2016

(54) CAPACITOR FOR TFT ARRAY SUBSTRATE AND METHOD OF MANUFACTURING THE SAME, AND DEVICES ASSOCIATED WITH THE SAME

(71) Applicants: BOE Technology Group Co., Ltd., Beijing (CN); Hefei BOE Optoelectronics Technology Co., Ltd., Anhui (CN)

(72) Inventors: Xiaohe Li, Beijing (CN); Xianjie Shao, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 14/408,717

(22) PCT Filed: Jun. 9, 2014

(86) PCT No.: PCT/CN2014/079479
§ 371 (c)(1),
(2) Date: Dec. 17, 2014

(87) PCT Pub. No.: WO2015/100948
PCT Pub. Date: Jul. 9, 2015

(65) Prior Publication Data
US 2015/0340385 A1    Nov. 26, 2015

(30) Foreign Application Priority Data
Dec. 31, 2013 (CN) .......................... 2013 1 0753392

(51) Int. Cl.
*H01L 27/13* (2006.01)
*H01L 27/12* (2006.01)

(52) U.S. Cl.
CPC .......... *H01L 27/1255* (2013.01); *H01L 27/127* (2013.01); *H01L 27/1262* (2013.01)

(58) Field of Classification Search
CPC ............ H01L 27/1255; H01L 27/1262; H01L 27/127
See application file for complete search history.

(56) References Cited

U.S. PATENT DOCUMENTS 5,182,661 A * 1/1993 Ikeda ...................... H01L 27/12
257/E27.11
2001/0022365 A1* 9/2001 Murade ............. H01L 29/78609
257/59

(Continued)

FOREIGN PATENT DOCUMENTS

CN       101369078 A     2/2009
CN       101978504 A     2/2011

(Continued)

OTHER PUBLICATIONS

International Search Report and Written Opinion for International Application No. PCT/CN2014/079479, dated Aug. 12, 2014, 7 pages.

(Continued)

*Primary Examiner* — Allan R Wilson
(74) *Attorney, Agent, or Firm* — Westman, Champlin & Koehler, P.A.

(57) ABSTRACT

The present invention discloses a capacitor for a TFT array substrate and a method of manufacturing the same, and the present invention further discloses a shift register, a gate driver, an array substrate and a display device using the capacitor. The TFT array substrate comprises a TFT gate layer, a gate insulation layer, a first ITO layer, a TFT active layer, a TFT source-drain layer, a passivation layer and a second ITO layer formed sequentially on a glass substrate, and the capacitor is consisted of the first ITO layer, the passivation layer and the second ITO layer. In addition, the second ITO layer is connected with the TFT gate layer in a region where the capacitor is located, thereby forming two capacitors connected in parallel; or, the first ITO layer is connected with the TFT gate layer in the region where the capacitor is located, thereby also forming two capacitors connected in parallel. With the present invention, a space occupied by the capacitor for the TFT array substrate is reduced, and a size of the shift register is reduced, so as to be suitable for a narrow frame design.

13 Claims, 5 Drawing Sheets

(56) References Cited

U.S. PATENT DOCUMENTS

| | | | | |
|---|---|---|---|---|
| 2002/0093016 | A1* | 7/2002 | Lim | H01L 29/04 257/59 |
| 2006/0119753 | A1* | 6/2006 | Luo | G02F 1/136213 349/38 |
| 2006/0145162 | A1* | 7/2006 | Yang | G02F 1/13454 257/72 |
| 2011/0012880 | A1* | 1/2011 | Tanaka | G09G 3/3677 345/211 |
| 2012/0161137 | A1* | 6/2012 | Lee | H01L 27/1255 257/59 |
| 2013/0222955 | A1* | 8/2013 | Yamazaki | H01L 27/1225 361/56 |

FOREIGN PATENT DOCUMENTS

| | | |
|---|---|---|
| CN | 102683338 A | 9/2012 |
| CN | 202975549 U | 6/2013 |
| CN | 103715207 A | 4/2014 |

OTHER PUBLICATIONS

English translation of Box No. V from the Written Opinion for the International Searching Authority for International Application No. PCT/CN2014/079479, 2 pages.

First Chinese Office Action including Search Report for Chinese Patent Application No. 201310753392.4, dated Oct. 8, 2015, 11 pages.

* cited by examiner

US 9,252,166 B2

CAPACITOR FOR TFT ARRAY SUBSTRATE AND METHOD OF MANUFACTURING THE SAME, AND DEVICES ASSOCIATED WITH THE SAME

CROSS-REFERENCE TO RELATED APPLICATION

This Application is a Section 371 National Stage Application of International Application No. PCT/CN2014/079479, filed 9 Jun. 2014, which has not yet published, which claims priority to Chinese Application 201310753392.4, filed Dec. 31, 2013, in Chinese, the contents of which are hereby incorporated by reference in their entirety.

BACKGROUND OF THE INVENTION

1. Field of the Invention

The present invention relates to the field of image display technologies, and specifically, to a TFT array substrate, particularly a capacitor for a TFT array substrate, a method of manufacturing the capacitor, and a shift register comprising the capacitor, a gate driver array substrate and a display device.

2. Description of the Related Art

A progressive scanning matrix display in an M×N dot matrix is employed in an image display panel comprising an array substrate for controlling a light source. Taking a TFT-LCD (thin film field effect transistor liquid crystal display) for an example, drivers of the array substrate mainly comprises a gate driver (scan driver) and a data driver, wherein an inputted clock signal, after converted by a shift register, is applied by the gate driver to a gate line of a liquid crystal display panel.

Shift registers are often used in gate drivers of a liquid crystal display panel, and each gate line is connected with one stage of circuit units of the shift register. Gate input signals are output by a gate drive circuit, so that respective pixels are scanned line by line. The gate drive circuit may be provided on the display panel in a packaging way such as COF (Chip On Film) or COG (Chip On Glass), or the gate drive circuit may be formed by TFTs (thin film field effect transistor) into an integrated circuit unit and formed in the display panel. For the liquid crystal display panel, a GOA (Gate On Array) design of a gate driver enables a reduction of production cost, a removal of one process step, and an increase in yield.

Generally, a shift register of a gate driver of a TFT-LCD is consisted of several TFTs and capacitors. FIG. 1 is schematic diagram showing a cascade configuration of a shift register of a TFT-LCD gate driver in prior arts. As can be seen from FIG. 1, a signal inputted at an input end Input of each stage of the shift register SR is a signal outputted from an output end Output of a previous stage of the shift register SR; an output signal at a reset end Reset of each stage of the shift register SR is a signal outputted from an output end Output of a next stage of the shift register SR. As such, the GOA-based gate drive circuit of the liquid crystal display can be turned on line by line, thereby achieving display of a screen.

FIG. 2 is a schematic diagram showing stages of a shift register in prior arts. As shown in FIG. 2, the shift register SR comprises a plurality of TFTs M1~M13 and a capacitor C1. With an increasing market demand in narrow frame design, development of narrow frame design is restricted more and more by a size of the shift register, especially a size of the capacitor, thus optimization of the size of the shift register has become an urgent matter at present. Currently, there are many existing technologies for optimizing and reducing the number of TFTs. Capacitor(s), however, is a necessary basic unit of a shift register and thus is indispensable. Further, there is at least one capacitor in a shift register, and a capacitance of the capacitor is at least from several picofarads (pf) to dozens of picofarads, that is, an area occupied by the capacitor is generally from 1,000 $\mu m^2$ to 1,000,000 $\mu m^2$. In general, when manufacturing a shift register of a gate driver of a TFT-LCD, a TFT gate layer may be used to form one electrode of capacitor, and a TFT source-drain layer may be used to form other electrode of the capacitor. Typically, TFT gate layer and TFT source-drain layer are made of a metal and are not transparent.

For almost all of current products, since the frame thereof is relatively narrow, there is a overlapped portion between a frame sealing glue and a GOA region; since the frame is relatively narrow, the frame sealing glue is substantially blocked and covered by a black matrix (BM) at a side of a CF (Color Filter), and UV cure of the frame sealing glue can only be performed from the TFT side, at this time, it is required that the capacitor is designed into a hollowed-out form so that UV light can pass therethrough so as to cure the sealing glue.

If an increased space for the hollowed-out design of a capacitor for the ultraviolet cure of the frame sealing glue is taken into account, the area of the capacitor needs to be increased by about 50%, which will significantly impacts the size of the frame. Generally, an product based on ADS (Advanced Super Dimension Switch) technology is manufactured by a liquid crystal process comprising sequentially forming a TFT gate layer, a gate insulation layer, a first ITO layer (pixel electrode), a TFT active layer, a TFT source-drain layer and then a TFT passivation layer, and finally a second ITO layer (common electrode).

Generally, when manufacturing a shift register of a gate driver of a TFT-LCD, a TFT gate layer may be used to form one electrode of capacitor, and a TFT source-drain layer may be used to form other electrode of the capacitor. At this time, a structure of the capacitor is shown in FIGS. 3A and 3B.

FIGS. 3A and 3B respectively show a capacitor design without being overlapped with a frame sealing glue and a capacitor design overlapped with a frame sealing glue. As shown in FIGS. 3A and 3B, an existing capacitor is consisted of a TFT gate layer 2, a gate insulation layer 3 and a TFT source-drain layer 4 sequentially formed on a glass substrate 1.

In such a case, a thickness of the gate insulation layer 3 between the TFT source-drain layer 4 and the TFT gate layer 2 is about 4,000 Å~5,000 Å; further, since the TFT gate layer 2 and TFT source-drain layer 4 are made of a non-transparent metal material, the TFT gate layer 2 and the TFT source-drain layer 4 need to be designed into a hollowed-out form when considering curing of the frame sealing glue. If it is intended that the capacitance of the capacitor remains unchanged and opposite area between the TFT gate layer 2 and TFT source-drain layer 4 cannot be reduced, the space occupied by the capacitor needs to be increased, thereby ensuring magnitude of the capacitance.

SUMMARY OF THE INVENTION

One problem to be solve by the present invention is in that the size of the capacitor is too large in prior art TFT array substrate, resulting in that the frame of TFT can be not be narrowed down.

In order to solve the above problem, the present invention provides a capacitor for a TFT array substrate, the TFT array substrate comprising a TFT gate layer, a gate insulation layer, a first ITO layer, a TFT active layer, a TFT source-drain layer, a passivation layer and a second ITO layer formed on a substrate, wherein the capacitor is formed by the first ITO layer, the passivation layer and the second ITO layer.

According to one preferred embodiment of the present invention, the second ITO layer is connected with the TFT gate layer in a region where the capacitor is located so that the capacitor is formed by two sub-capacitors connected in parallel, one of the two sub-capacitors comprises two electrodes consisted of the TFT gate layer and the first ITO layer, and the other one of the two sub-capacitors comprises two electrodes consisted of the first ITO layer and the second ITO layer.

According to one preferred embodiment of the present invention, the first ITO layer is connected with the TFT gate layer in a region where the capacitor is located so that the capacitor is formed by two sub-capacitors connected in parallel, one of the two sub-capacitors comprises two electrodes consisted of the TFT gate layer and the second ITO layer, and the other one of the two sub-capacitors comprises two electrodes consisted of the first ITO layer and the second ITO layer.

According to one preferred embodiment of the present invention, a distance between two electrodes of the capacitor is in a range from 2,000 Å to 2,500 Å.

The present invention further provides a method of manufacturing a capacitor for a TFT array substrate, the TFT array substrate comprising a TFT gate layer, a gate insulation layer, a first ITO layer, a TFT active layer, a TFT source-drain layer, a passivation layer and a second ITO layer formed on a substrate; when manufacturing the array substrate, the first ITO layer is used to form one electrode of the capacitor, the passivation layer is used to dielectric of the capacitor, and the second ITO layer is used to form other electrode of the capacitor.

According to one preferred embodiment of the present invention, the second ITO layer is connected with the TFT gate layer in a region where the capacitor is located so that the capacitor is formed by two sub-capacitors connected in parallel; when manufacturing the gate driver, the TFT gate layer and the first ITO layer are used to form two electrodes of one of the two sub-capacitors, and the first ITO layer and the second ITO layer are used to form two electrodes of the other one of the two sub-capacitors.

According to one preferred embodiment of the present invention, the first ITO layer is connected with the TFT gate layer in a region where the capacitor is located so that the capacitor is formed by two sub-capacitors connected in parallel; when manufacturing the gate driver, the TFT gate layer and the second ITO layer are used to form two electrodes of one of the two sub-capacitors, and the first ITO layer and the second ITO layer are used to form two electrodes of the other one of the two sub-capacitors.

According to one preferred embodiment of the present invention, when manufacturing the array substrate, a HTM mask plate is used to form a pattern of the passivation layer, a translucent region of the HTM mask plate corresponding to a region of the passivation layer used as a dielectric layer of the capacitor; after finishing etching of portions of the passivation layer which are desired to be completely etched off, a portion of a photoresist corresponding to the translucent region is fully ashed off such that a portion of the photoresist corresponding to a fully opaque region has a height left at this time; a portion of the passivation layer corresponding to the translucent region is etched, and a thickness of the portion of the passivation layer corresponding to the translucent is reduced by selecting an etching time.

The present invention further provides a shift register unit for a TFT array substrate, comprising the capacitor as described above.

The present invention further provides a gate driver comprising the shift register unit.

The present invention further provides an array substrate comprising the capacitor as described above.

The present invention further provides a display device comprising the gate driver as described above.

With the present invention, a space occupied by the capacitor for the TFT array substrate, that is, the size of the capacitor is optimized, which significantly reducing the size of the shift register, thereby providing a new way in development of a narrow frame type TFT array substrate.

DETAILED DESCRIPTION OF PREFERRED EMBODIMENTS OF THE INVENTION

In order to provide a more clear understanding of objects, technique solutions and advantages of the present invention, the present invention will be further described hereinafter in detail in conjunction with and with reference to the attached drawings.

A TFT array substrate is divided into a display region and a non-display region. When manufacturing the TFT array substrate, patterns of pixel units, gate lines, data lines and the like are formed in the display region, and a gate driver is formed in the non-display region. The TFT array substrate comprises a plurality of shift registers, each shift register is consisted of several TFTs and at least one capacitor. The capacitor within the non-display region is generally a parallel plate capacitor consisted of an upper electrode plate, a lower electrode plate, and a dielectric layer sandwiched therebetween. The capacitor is a unit inside of a GOA-based gate drive circuit, thus one row of the gate lines corresponds to one capacitor.

TFT array substrate comprises a TFT gate layer, a gate insulation layer, a first ITO layer (tin indium oxide, used as a pixel electrode), a TFT active layer, a TFT source-drain layer, a passivation layer and a second ITO layer (common electrode) formed sequentially on a substrate. The substrate may be a plastic substrate or a glass substrate.

Figure 1:
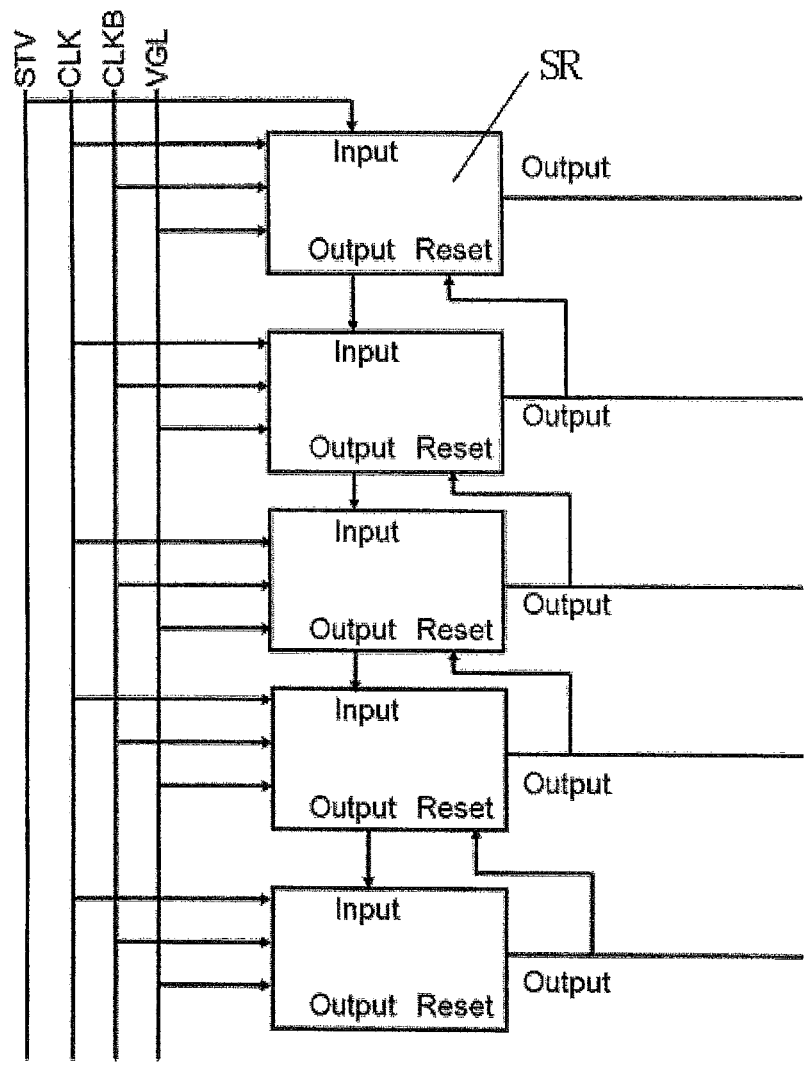
FIG. 1 is schematic diagram showing a cascade configuration of a shift register of a TFT-LCD gate driver in prior arts.
Figure 2:
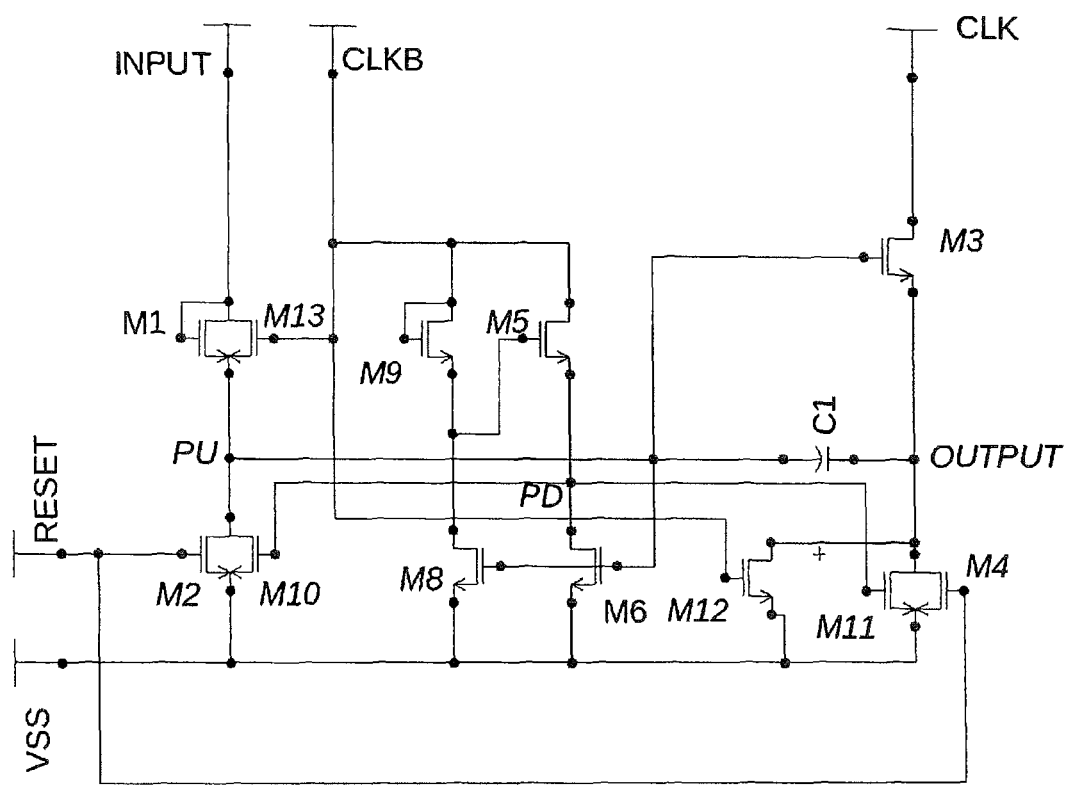
FIG. 2 is a schematic diagram showing stages of a shift register in prior arts.
Figure 3A:
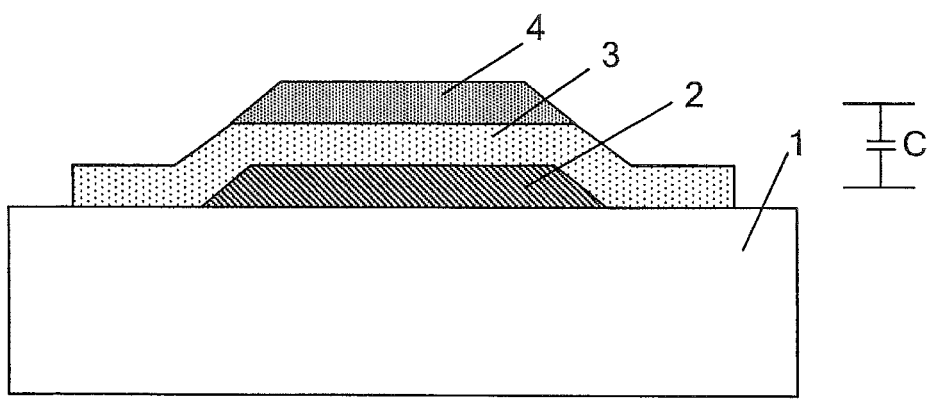
FIGS. 3A and 3B respectively show a capacitor design without being overlapped with a frame sealing glue and a capacitor design overlapped with a frame sealing glue.
Figure 3B:
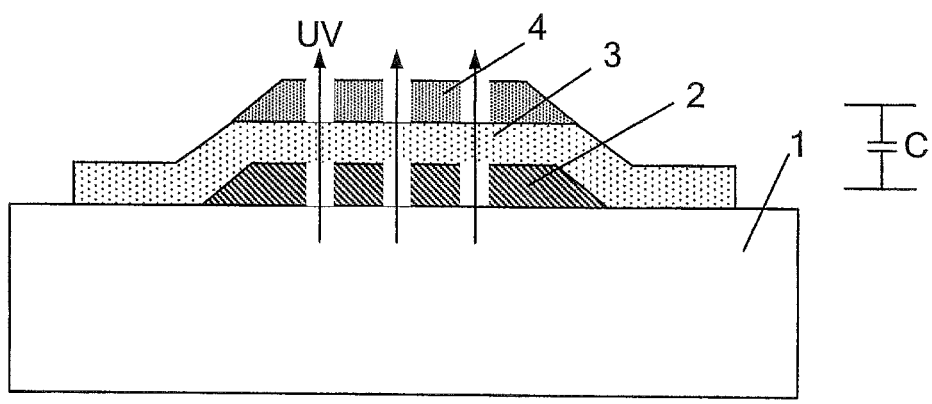
Figure 4:
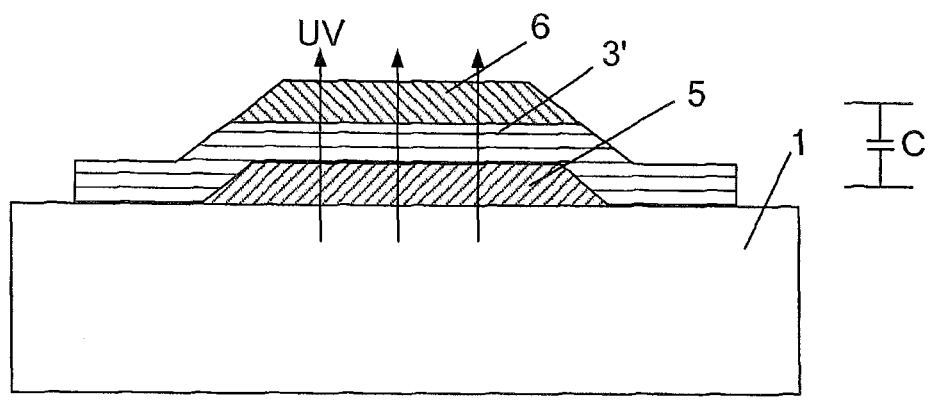
FIG. 4 is a sectional view showing a capacitor of a first embodiment of a TFT array substrate according to the present invention.

FIG. 4 is a sectional view showing a capacitor of a first embodiment of a TFT array substrate according to the present invention. In order to reduce the space occupied by the capacitor, as shown in FIG. 4, the capacitor in this embodiment is consisted of the first ITO layer 5, the passivation layer (PVX, for short) 3' and the second ITO layer 6 formed sequentially on the substrate 1. As can be seen, one electrode of the capacitor in this embodiment is formed by the first ITO layer 5, the other electrode is formed by the second ITO layer 6, and the intermediate passivation layer 3' is used as a dielectric layer of the capacitor.

Generally, a process flow of manufacturing a TFT array substrate in a HADS (High Advanced Super Dimension Switch) comprises sequentially forming a TFT gate layer, a gate insulation layer, a TFT active layer, a first ITO layer, a TFT source-drain layer, a TFT passivation layer, and a second ITO layer on a glass substrate, wherein the process sequences of forming the TFT source-drain layer and forming the first ITO are interchangeable.

With the above process, when manufacturing the capacitor according to this embodiment, a process for manufacturing the TFT array substrate will not be extended, and it is only required that a corresponding pattern is previously formed in a region of a mask plate where the capacitor is to be formed. While forming patterns of the first ITO layer, the passivation layer and the second ITO layer within the display region, one electrode of the capacitor within the non-display region can be correspondingly formed by the first ITO layer, a dielectric layer can be formed by the passivation layer, and the other electrode of the capacitor can be formed by the second ITO layer.

As such, compared to prior arts, the dielectric layer of the capacitor is changed into the passivation layer 3' from the gate insulation layer when performing the process, and has a thickness between 2,000 Å and 2,500 Å (that is, a distance between the two electrodes of capacitor). That is, the thickness of the dielectric layer of the capacitor is changed to 2,500 Å from a conventional thickness of 4,000 Å; at this time, according to a capacitance formula, that is, $C=\in \cdot S/d$, a spacing d is reduced to 0.625 times, that is, the area S can be reduced by 37.5%. Thus, in case of keeping the capacitance and electricity storage capacity of the capacitor unchanged, an area of the electrodes of the capacitor can be reduced from 1,000,000 $\mu m^2$ to 625,000 $\mu m^2$, that is, reduced by 37.5%, which provide an extremely large space for optimizing and achieving a narrow frame design.

More importantly, the two electrodes of the capacitor are made of ITO and thus are transparent electrodes, that is, are light transmittable. If an UV curing of the frame sealing glue is required, the electrodes need not to be hollowed out, thus, the area occupied by the capacitor can be degreased by about 60%, which greatly reduces the space occupied by the capacitor, thereby providing an extremely large space for optimizing and achieving a narrow frame design.

Figure 5:
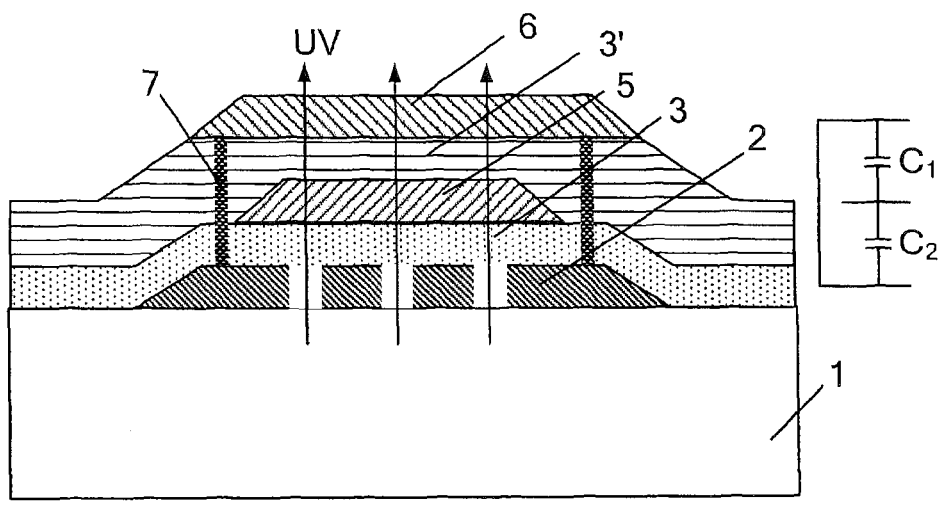
FIG. 5 is a sectional view showing a capacitor according to a second embodiment of the present invention.

FIG. 5 is a sectional view showing a capacitor according to a second embodiment of the present invention. As shown in FIG. 5, the capacitor comprises a TFT gate layer 2, a gate insulation layer 3, a first ITO layer 5, a passivation layer 3', and a second ITO layer 6 formed sequentially on a glass substrate 1, wherein the second ITO layer 6 is connected with the TFT gate layer 2. In other words, the capacitor is formed by two sub-capacitors C1 and C2 connected in parallel, and thereby a total capacitance C equals to the sum of the capacitances of the two sub-capacitors C1 and C2 (C=C1+C2); the TFT gate layer 2 and the first ITO layer 5 are used as two electrodes of the capacitor C2, and the first ITO layer 5 and the second ITO layer 6 are used as two electrodes of the capacitor C1.

When manufacturing the capacitor according to this embodiment, similarly, it is only required that a corresponding pattern is previously formed in a region of a mask plate where the capacitor is to be formed. Then, while forming patterns of the first ITO layer, the passivation layer and the second ITO within the display region, one electrode of the capacitor C2 within the non-display region can be correspondingly formed by the first ITO layer, a dielectric layer of the capacitor C2 can be correspondingly formed by the gate insulation layer, and the other electrode of the capacitor C2 can be formed by the first ITO layer; further, one electrode of the capacitor C1 within the non-display region can be correspondingly formed by the first ITO layer, a dielectric layer of the capacitor C1 can be correspondingly formed by the passivation layer, and the other electrode of the capacitor C1 can be formed by the second ITO layer.

It should be noted that, in this embodiment, a via 7 for connecting the second ITO layer 6 and the TFT gate layer 2 is formed at the same time of forming the pattern of the passivation layer, so as to realize a parallel connection of the two capacitors.

In this embodiment, not only a UV transmittance is not affected when curing the frame sealing glue, but also the space occupied by the capacitor is further reduced without changing the magnitude of its capacitance, thereby further reducing the frame of the array substrate.

Figure 6:
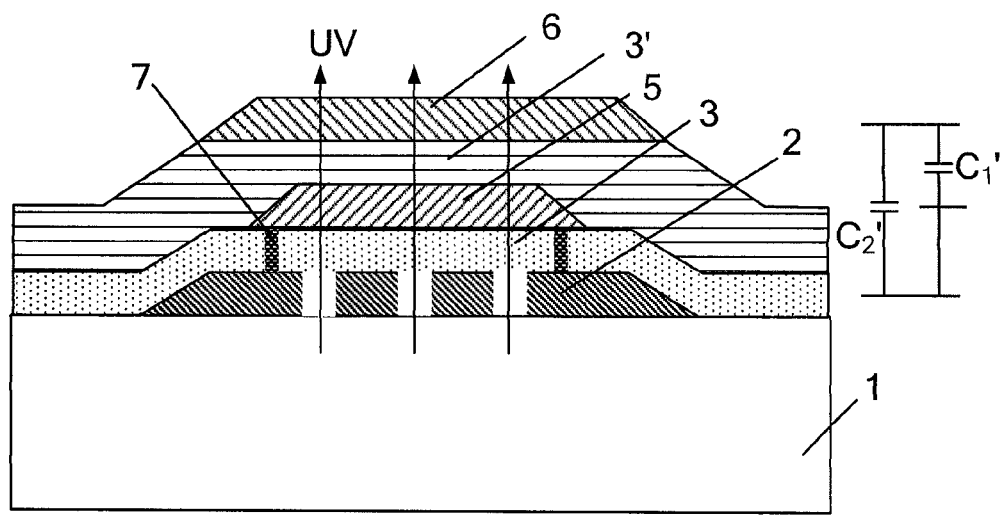
FIG. 6 is a sectional view showing a capacitor according to a third embodiment of the present invention.

FIG. 6 is a sectional view showing a capacitor according to a third embodiment of the present invention. As shown in FIG. 6, the capacitor according to the third embodiment has a structure similar to that of the capacitor in the second embodiment, and the only difference lies in that, in this embodiment, the TFT gate layer 2 is connected with the first ITO layer 5. That is, the TFT gate layer 2 and the second ITO layer 6 are used as two electrodes of a sub-capacitor C2', the first ITO layer and second ITO layer are used as two electrodes of a sub-capacitor C1', thereby a total capacitance C equals to the sum of the capacitances of the two sub-capacitors C1', C2' (C=C1'+C2').

When manufacturing the capacitor according to the third embodiment, similarly, it is only required that a corresponding pattern is previously formed in a region of a mask plate where the capacitor is to be formed. Then, while forming patterns of the first ITO layer, the passivation layer and the second ITO within the display region. One electrode of the capacitor C2' within the non-display region can be correspondingly formed by the TFT gate layer, a dielectric layer of the capacitor C2' can be correspondingly formed by the gate insulation layer and the passivation layer, and the other electrode of the capacitor C2' can be formed by the second ITO layer; further, one electrode of the capacitor C1' within the non-display region can be correspondingly formed by the first ITO layer, a dielectric layer of the capacitor C1' can be correspondingly formed by the passivation layer, and the other electrode of the capacitor C1' can be formed by the second ITO layer.

It should be noted that in this embodiment, it is required to form a via to connect the first ITO layer 5 and the TFT gate layer 2 at the same time of forming the pattern of the gate insulation layer, so as to realize a parallel connection of the two capacitors.

In the embodiments shown in FIG. 5 and FIG. 6, since two capacitors are formed in parallel so as to reduce area of the capacitors, the two parallel capacitors need to be connected with each other through the via. In the embodiment shown in FIG. 5, no additional process step is required for the via. In manufacturing process of a panel, a pattern of a mask plate for the passivation layer is changed when etching the passivation layer, wherein the change is in that a pattern of vias is designed for purpose of forming a via between the second ITO layer and the TFT gate layer. For the embodiment shown in FIG. 6, it is required to connect the first ITO layer with TFT gate layer; for a product made through a process comprising a step of etching the gate insulation layer, the etching step may be shared to form the via 7 in the gate insulation layer;

while for a product made through a process without such an etching step, an additional etching step is required to etch the gate insulation layer so as to form the via 7 therein. This step is generally performed after forming the gate insulation layer 3 and before forming the first ITO layer 5.

Similarly, in this embodiment, not only a UV transmittance is not affected when curing the frame sealing glue, but also the space occupied by the capacitor is further reduced without changing the magnitude of its capacitance, thereby further reducing the frame of the array substrate.

Figure 7:
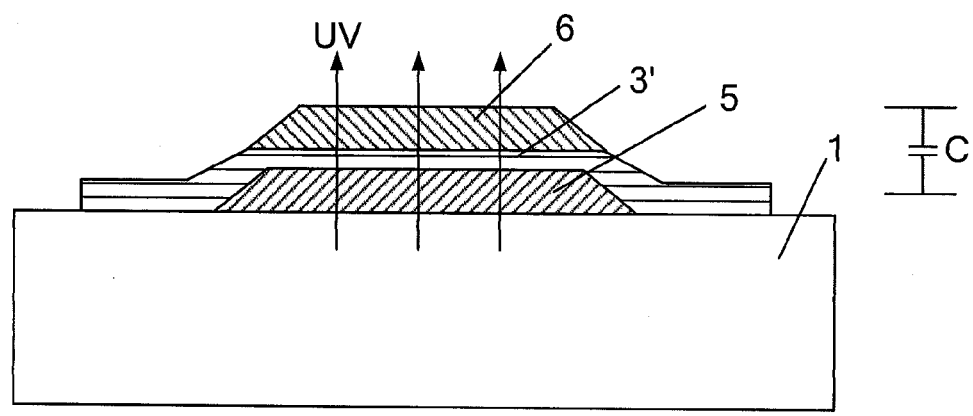
FIG. 7 is a sectional view showing a capacitor according to a fourth embodiment of the present invention.

FIG. 7 is a sectional view showing a capacitor according to a fourth embodiment of the present invention. Compared with embodiment shown in the FIG. 4, the thickness of the passivation layer 3' in this embodiment is further reduced, as shown in FIG. 7. In this embodiment, a Half Tone Mask (HTM) is used when forming the pattern of the passivation layer, and a translucent region of the HTM corresponding to a region of the passivation layer where the capacitor is located, thus the formed passivation layer can be further thinned.

Further, during manufacturing the capacitors according to the above three embodiments, the method of using a Half Tone Mask (HTM) when etching the passivation layer 3' according to the fourth embodiment can be used. That is, when etching the passivation layer 3', a portion of the passivation layer corresponding to the capacitor is etched by using the HTM process, so as to reduce transmittance of the mask.

A particular HTM mask plate is used when forming the passivation layer. This mask plate is divided into three regions comprising: a fully transparent region, a fully opaque region, and a translucent region.

The fully transparent region of the mask plate corresponds to a portion of the passivation layer to be fully etched off, such a peripheral non-display region where a via needs to be formed; for the portion of the passivation layer where the capacitor is to be formed, since this portion needs to be thinned with some remnants, this portion corresponds to the translucent region of the mask plate. Other portions of the passivation layer which will be fully remained, such as portions of the passivation layer within the display region, correspond to the fully opaque region of the mask plate.

After forming a corresponding pattern of a photoresist by using the mask plate, the passivation layer is etched. Firstly, the portion of the passivation layer which needs to be fully etched off is fully etched off, generally by a dry etching process. Then, the thickness of the photoresist is thinned so that a portion of the photoresist corresponding to the translucent region is fully ashed off, and a portion of the photoresist corresponding to the fully opaque region has a height remained at this time. Then, the portion of the passivation layer corresponding to the translucent region is etched, so that the portion of the PVX where the capacitor is to be formed is reduced by selecting a suitable etching time (for example, the etching time is reduced into half of an etching time for the fully transparent region, or the like), thereby achieving the purpose of reducing the insulation layer between the first ITO layer and second ITO layer and further reducing the area of the capacitor.

Here, since the HTM process is employed, the thickness of the passivation layer 3' at the capacitor is only thinned, and the passivation layer 3' will not be fully etched off, the thickness of the passivation layer 3' at the capacitor is thereby reduced, and the distance between two electrode plates of the capacitor is reduced, such that the area of the capacitor can be further reduced without changing its capacitance.

In summary, with the present invention, design of the capacitor of the shift register is optimized to reduce the space occupied by the shift register, which is particularly important to a narrow frame type liquid crystal display. the capacitor according to the present invention, which only occupies 10% of a space occupied by a conventional capacitor, has the same capacitance as the conventional capacitor, and a capacitor area of about 9,000~900,000 $\mu m^2$ can be saved.

The present invention further provides an array substrate comprising the capacitor in the above embodiments.

The present invention further provides a shift register unit and a gate driver, comprising the capacitor in the above embodiments.

The present invention further provides a display device, specifically, the display device may be a liquid crystal display device, such as a liquid crystal panel, a liquid crystal TV, a mobile phone, a liquid crystal display, or the like, comprising a color filter substrate, and the array substrate in the above embodiments; in addition to the liquid crystal display device, the display device may be other types of display devices, such as an e-book reader or the like, which does not comprise any color filter substrate, but comprises the capacitor and gate driver in the above embodiments. The display device may also include an organic electroluminescence display comprising the capacitor and gate driver in the above embodiments.

The objects, technique solutions and advantageous effects of the present invention have been illustrated in detail in the above specific embodiments. It should be understood that the above description is only used to illustrate specific embodiments of the present invention, and is not intended to limit the present invention. Modifications, equivalent alternatives and improvements made within principles and spirit of the present invention are included within protective scope of the present invention.

What is claimed is:

1. A capacitor for a TFT array substrate, the TFT array substrate comprising a TFT gate layer, a gate insulation layer, a first ITO layer, a TFT active layer, a TFT source-drain layer, a passivation layer and a second ITO layer formed sequentially on a substrate comprising a display region and a non-display region, wherein the capacitor is formed by portions of the TFT gate layer, the gate insulation layer, the first ITO layer, the passivation layer and the second ITO layer within the non-display region.

2. The capacitor for a TFT array substrate according to claim 1, wherein the second ITO layer is connected with the TFT gate layer in a region where the capacitor is located so that the capacitor is formed by two sub-capacitors connected in parallel, one of the two sub-capacitors comprises two electrodes consisted of the TFT gate layer and the first ITO layer, and the other one of the two sub-capacitors comprises two electrodes consisted of the first ITO layer and the second ITO layer.

3. The capacitor for a TFT array substrate according to claim 1, wherein the first ITO layer is connected with the TFT gate layer in a region where the capacitor is located so that the capacitor is formed by two sub-capacitors connected in parallel, one of the two sub-capacitors comprises two electrodes consisted of the TFT gate layer and the second ITO layer, and the other one of the two sub-capacitors comprises two electrodes consisted of the first ITO layer and the second ITO layer.

4. The capacitor for a TFT array substrate according to claim 2, wherein a distance between two electrodes of the other sub-capacitor is in a range from 2,000 Å to 2,500 Å.

5. The capacitor for a TFT array substrate according to claim 3, wherein a distance between two electrodes of the other sub-capacitor is in a range from 2,000 Å to 2,500 Å.

6. A gate driver, comprising a shift register unit comprising the capacitor according to claim 1.

7. A display device, comprising the gate driver according to claim 6.

8. A method of manufacturing a capacitor for a TFT array substrate, comprising sequentially forming a TFT gate layer, a gate insulation layer, a first ITO layer, a TFT active layer, a TFT source-drain layer, a passivation layer and a second ITO layer on a substrate comprising a display region and a non-display region,
   wherein the capacitor is formed by portions of the TFT gate layer, the gate insulation layer, the first ITO layer, the passivation layer and the second ITO layer within the non-display region.

9. The method of manufacturing a capacitor for a TFT array substrate according to claim 8, wherein, the second ITO layer is connected with the TFT gate layer in a region where the capacitor is located so that the capacitor is formed by two sub-capacitors connected in parallel,
   the TFT gate layer and the first ITO layer are used to form two electrodes of one of the two sub-capacitors, and the first ITO layer and the second ITO layer are used to form two electrodes of the other one of the two sub-capacitors.

10. The method of manufacturing a capacitor for a TFT array substrate according to claim 8, wherein, the first ITO layer is connected with the TFT gate layer in a region where the capacitor is located so that the capacitor is formed by two sub-capacitors connected in parallel,
    the TFT gate layer and the second ITO layer are used to form two electrodes of one of the two sub-capacitors, and the first ITO layer and the second ITO layer are used to form two electrodes of the other one of the two sub-capacitors.

11. The method of manufacturing a capacitor for a TFT array substrate according to claim 8, wherein,
    when manufacturing the array substrate, a HTM mask plate is used to form a pattern of the passivation layer, a translucent region of the HTM mask plate corresponding to a region of the passivation layer used as a dielectric layer of the capacitor;
    after finishing etching of portions of the passivation layer which are desired to be completely etched off, a portion of a photoresist corresponding to the translucent region is fully ashed off such that a portion of the photoresist corresponding to a fully opaque region of the HTM mask plate has a height left at this time;
    a portion of the passivation layer corresponding to the translucent region is etched, and a thickness of the portion of the passivation layer corresponding to the translucent is reduced by selecting an etching time.

12. The method of manufacturing a capacitor for a TFT array substrate according to claim 9, wherein,
    when manufacturing the array substrate, a HTM mask plate is used to form a pattern of the passivation layer, a translucent region of the HTM mask plate corresponding to a region of the passivation layer used as a dielectric layer of the capacitor;
    after finishing etching of portions of the passivation layer which are desired to be completely etched off, a portion of a photoresist corresponding to the translucent region is fully ashed off such that a portion of the photoresist corresponding to a fully opaque region of the HTM mask plate has a height left at this time;
    a portion of the passivation layer corresponding to the translucent region is etched, and a thickness of the portion of the passivation layer corresponding to the translucent is reduced by selecting an etching time.

13. The method of manufacturing a capacitor for a TFT array substrate according to claim 10, wherein,
    when manufacturing the array substrate, a HTM mask plate is used to form a pattern of the passivation layer, a translucent region of the HTM mask plate corresponding to a region of the passivation layer used as a dielectric layer of the capacitor;
    after finishing etching of portions of the passivation layer which are desired to be completely etched off, a portion of a photoresist corresponding to the translucent region is fully ashed off such that a portion of the photoresist corresponding to a fully opaque region of the HTM mask plate has a height left at this time;
    a portion of the passivation layer corresponding to the translucent region is etched, and a thickness of the portion of the passivation layer corresponding to the translucent is reduced by selecting an etching time.

* * * * *